United States Patent
Watanabe

(10) Patent No.: US 12,253,559 B2
(45) Date of Patent: Mar. 18, 2025

(54) ALIGNMENT METHOD AND INSPECTION APPARATUS

(71) Applicant: TOKYO ELECTRON LIMITED, Tokyo (JP)

(72) Inventor: Shinjiro Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/747,867

(22) Filed: May 18, 2022

(65) Prior Publication Data

US 2022/0381820 A1 Dec. 1, 2022

(30) Foreign Application Priority Data

May 31, 2021 (JP) ................................. 2021-091638

(51) Int. Cl.
*G01R 31/28* (2006.01)
(52) U.S. Cl.
CPC ................................. *G01R 31/2887* (2013.01)
(58) Field of Classification Search
CPC G01R 31/28; G01R 31/2851; G01R 31/2887; G01R 1/07307; G01R 1/07364; G01R 31/2889
USPC .................................................. 324/750, 160
See application file for complete search history.

(56) References Cited

U.S. PATENT DOCUMENTS

| | | | | |
|---|---|---|---|---|
| 4,052,793 A * | 10/1977 | Coughlin | ................. | G05D 3/00 33/645 |
| 4,786,867 A * | 11/1988 | Yamatsu | ............ | G01R 1/07342 324/754.13 |
| 5,274,575 A * | 12/1993 | Abe | .................... | G01R 31/2887 356/400 |
| 5,539,676 A * | 7/1996 | Yamaguchi | ........ | G01R 1/07314 324/750.16 |
| 5,644,245 A * | 7/1997 | Saitoh | ................ | G01R 31/2891 324/750.18 |
| 6,298,312 B1 * | 10/2001 | Chen | ...................... | G01R 35/00 324/754.11 |

(Continued)

FOREIGN PATENT DOCUMENTS

| | | | | |
|---|---|---|---|---|
| CN | 102301462 A | * | 12/2011 | ......... G01R 31/2891 |
| CN | 113640557 A | * | 11/2021 | |

(Continued)

OTHER PUBLICATIONS

"Unmatched Versatility, Performance, Safety and Reliability ." Eaton, Date published online Apr. 2016, Date accessed online Aug. 2023, www.eaton.com/ecm/groups/public/@pub/@electrical/documents/content/pa140009en.pdf. (Year: 2016).*

(Continued)

*Primary Examiner* — Lisa M Caputo
*Assistant Examiner* — Joshua L Forristall
(74) *Attorney, Agent, or Firm* — Fenwick & West LLP

(57) ABSTRACT

An alignment method of a probe card includes a plurality of probe groups provided corresponding to a plurality of chips, comprising: a first mode for calculating a gradient and a center of a probe group based on position information of two or more probes included in the probe group for each of the plurality of chips and calculating a gradient and a center of the probe card based on the calculated gradients and the calculated centers of the plurality of probe groups.

7 Claims, 9 Drawing Sheets

(56) References Cited

U.S. PATENT DOCUMENTS

| | | | |
|---|---|---|---|
| 7,486,089 B2 | 2/2009 | Abe | |
| 2004/0036861 A1* | 2/2004 | Yoshioka | G01R 31/2887 356/237.1 |
| 2006/0267613 A1* | 11/2006 | Takahashi | G01R 31/2891 324/762.05 |
| 2007/0057683 A1* | 3/2007 | Abe | G01R 31/2891 324/750.16 |
| 2008/0068618 A1* | 3/2008 | Kagami | H01L 21/681 356/620 |
| 2010/0321052 A1* | 12/2010 | Ogino | G01R 31/2887 324/750.16 |
| 2012/0062259 A1* | 3/2012 | Yamada | G01R 31/2893 324/750.25 |
| 2014/0348411 A1* | 11/2014 | Tanaka | G06T 7/20 382/133 |
| 2015/0362552 A1* | 12/2015 | Ozawa | G01R 1/07307 324/750.23 |
| 2020/0209303 A1* | 7/2020 | Liu | G01R 31/2626 |

FOREIGN PATENT DOCUMENTS

| | | | |
|---|---|---|---|
| JP | 2005340696 A | * | 12/2005 |
| JP | 2009231765 A | | 10/2009 |
| KR | 10-2007-0029572 A | | 3/2007 |
| KR | 10-2010-0056727 A | | 5/2010 |
| KR | 20100124913 A | * | 11/2010 |
| KR | 10-2016-0025291 A | | 3/2016 |

OTHER PUBLICATIONS

"Gradient, adj. & n.". Oxford English Dictionary, Oxford University Press, Jul. 2023, <https://www.google.com/search?sca_esv=561439799&rlz=1C1GCEA_enUS1063US1063&q=gradient&si=ACFMAn8_M7eJwStsnxyYBiM9E06iDuG1yS-X_-pq4fyCmKXo7slVojGyKCnRrPZij1bisH2FuOamCLFW0PJsa_2JPhmsjQR-Y02gaWjiDEG36NC1e_I98EU%3D&expnd=1&sa=X&ve>.*

* cited by examiner

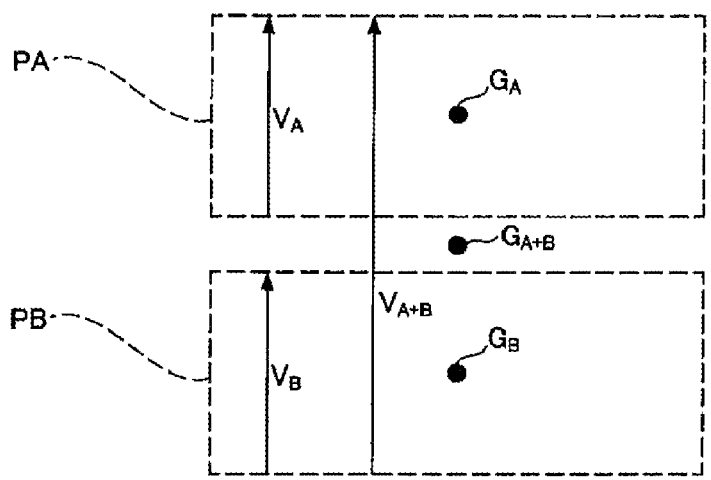
FIG.8A
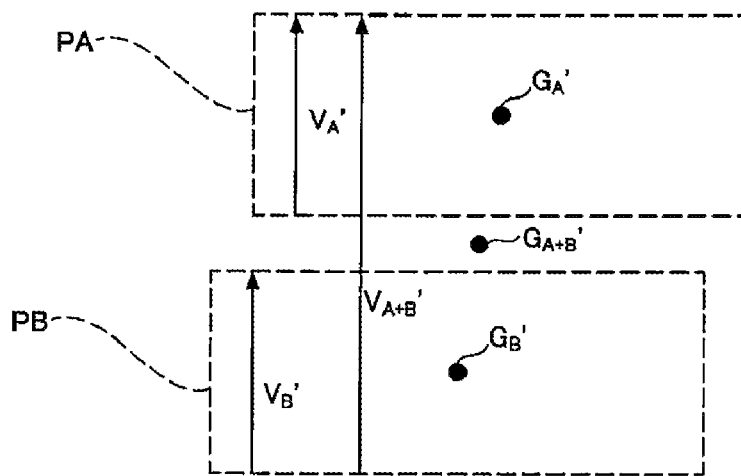
FIG.8B
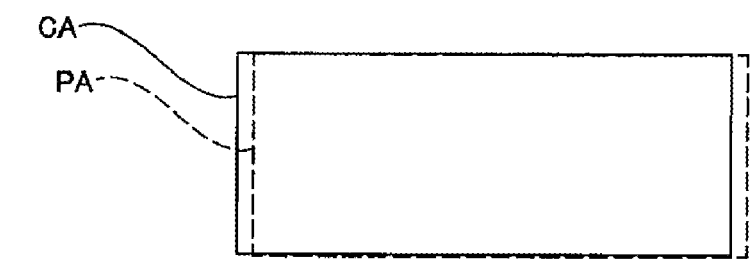
FIG.8C

ALIGNMENT METHOD AND INSPECTION APPARATUS

CROSS-REFERENCE TO RELATED APPLICATION

This application claims priority to Japanese Patent Application No. 2021-091638 filed on May 31, 2021, the entire contents of which are incorporated herein by reference.

TECHNICAL FIELD

The present disclosure relates to an alignment method and an inspection apparatus.

BACKGROUND

There is known a technique for adjusting a gradient of a probe card such that the distances between needle tips of probes at four corners of the probe card and four electrode pads facing them are equal to one another in the case of performing inspection by bringing a substrate into contact with the probes of the probe card (see, e.g., Japanese Patent Application Publication No. 2009-231765).

SUMMARY

The present disclosure provides a technique capable of aligning electrode pads and probes with a high accuracy.

In accordance with an aspect of the present disclosure, there is provided an alignment method of a probe card including a plurality of probe groups provided corresponding to a plurality of chips, comprising: a first mode for calculating a gradient and a center of a probe group based on position information of two or more probes included in the probe group for each of the plurality of chips and calculating a gradient and a center of the probe card based on the calculated gradients and the calculated centers of the plurality of probe groups.

BRIEF DESCRIPTION OF THE DRAWINGS

The objects and features of the present disclosure will become apparent from the following description of embodiments, given in conjunction with the accompanying drawings, in which:

FIGS. 8A to 8C explain a positional relationship between a probe group and a chip in the chip unit mode.

DETAILED DESCRIPTION

Figure 1:
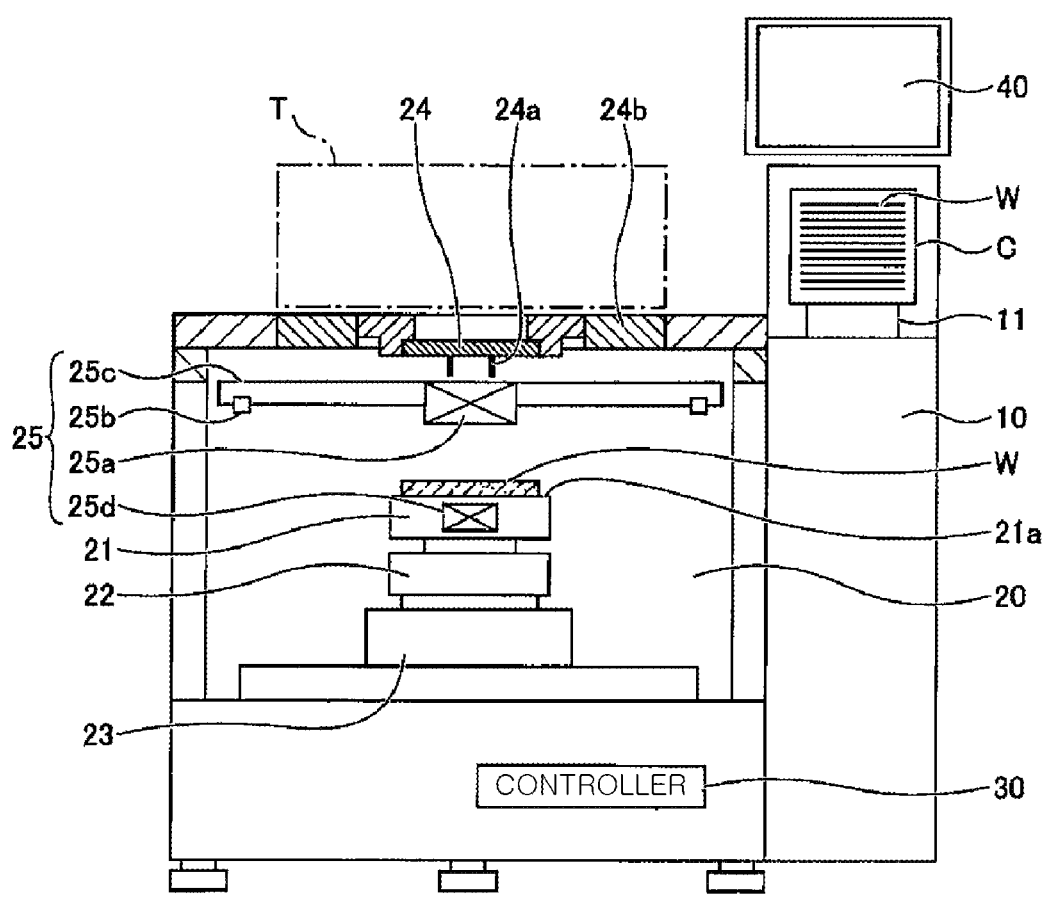
FIG. 1 shows an example of an inspection apparatus according to an embodiment.

Hereinafter, non-limiting exemplary embodiments of the present disclosure will be described in detail with reference to the accompanying drawings. Like reference numerals will be given to like or corresponding parts throughout the drawings, and redundant description thereof will be omitted.

Inspection Apparatus

Figure 2:
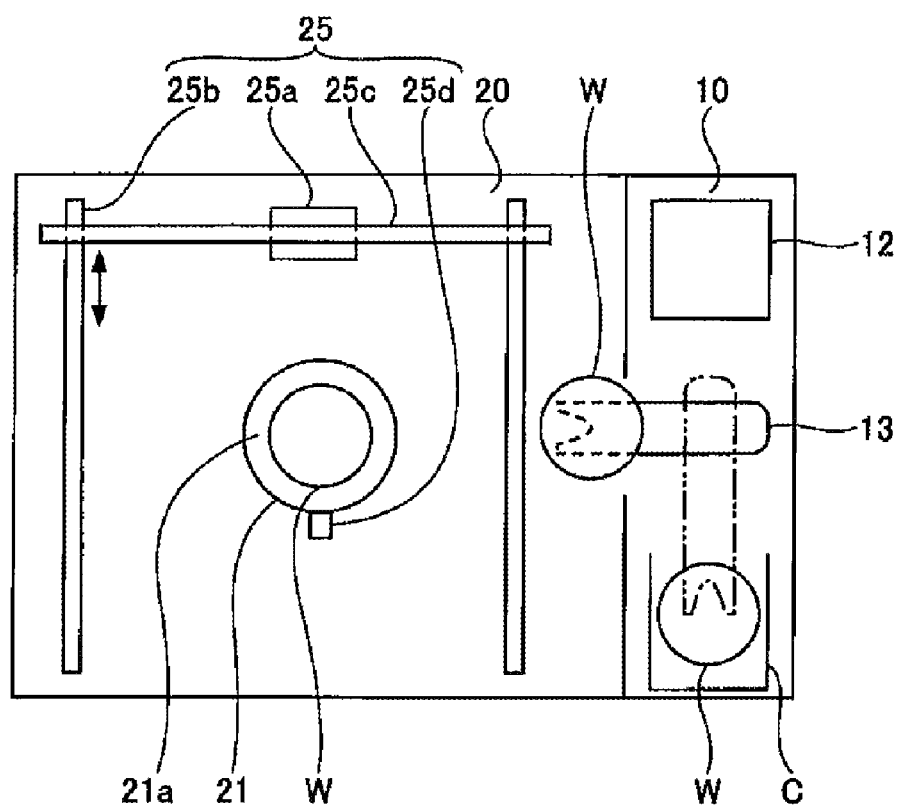
FIG. 2 is a plan view of the inspection apparatus of FIG. 1.
Figure 2:
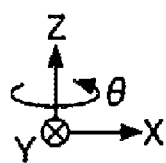
Figure 3:
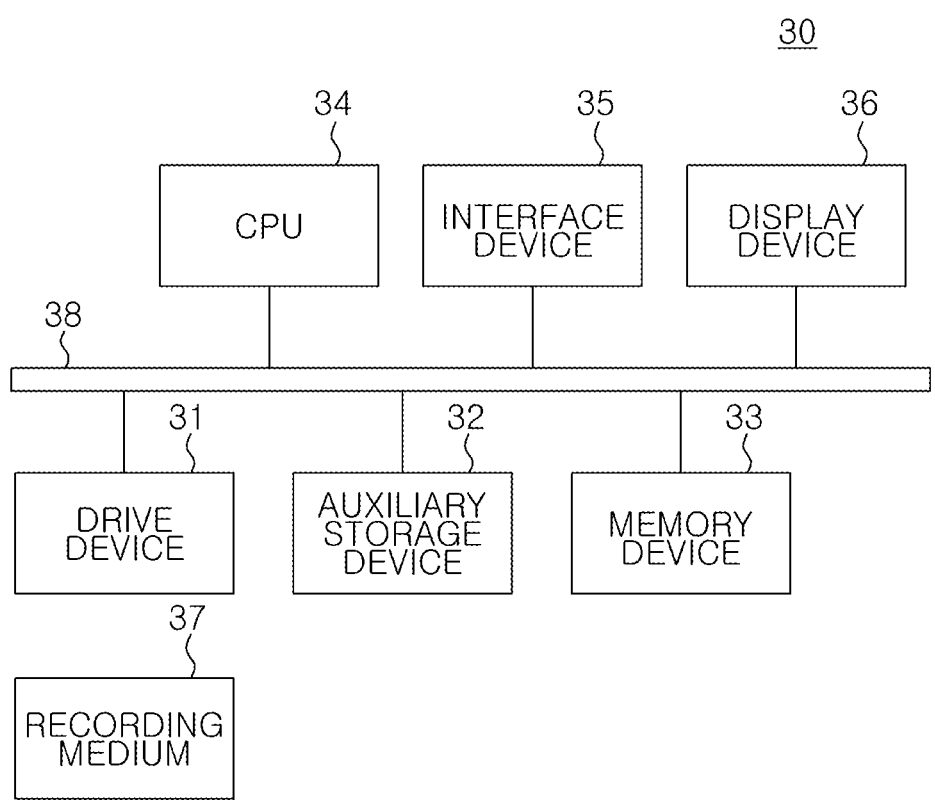
FIG. 3 shows an example of a hardware configuration of a controller.

An example of an inspection apparatus according to an embodiment will be described with reference to FIGS. 1 to 3. The inspection apparatus according to the embodiment inspects various electrical characteristics by applying electric signals to a plurality of devices under test (DUT) formed on a substrate. In the following description, a case where the substrate is a semiconductor wafer (hereinafter, simply referred to as "wafer") and the device under test is a semiconductor chip (hereinafter, simply referred to as "chip") will be described as an example. The semiconductor chip includes an electrode pad.

The inspection apparatus 1 includes a loader 10, an inspection part 20, a controller 30, and the like.

The loader 10 includes a load port 11, an aligner 12, a substrate transfer mechanism 13, and the like. A cassette C accommodating the wafer W is mounted on the load port 11. The aligner 12 aligns the wafer W. The substrate transfer mechanism 13 transfers the wafer W between the cassette C mounted on the load port 11, the aligner 12, and a substrate support 21 to be described later.

In the loader 10, first, the substrate transfer mechanism 13 transfers the wafer W accommodated in the cassette C to the aligner 12. Then, the aligner 12 aligns the wafer W. Next, the substrate transfer mechanism 13 transfers the wafer W aligned by the aligner 12 to the substrate support 21 of the inspection part 20.

The inspection part 20 is disposed adjacent to the loader 10. The inspection part 20 includes the substrate support 21, an elevating and rotating mechanism 22, an XY stage 23, a probe card 24, an alignment mechanism 25, and the like.

The substrate support 21 has a substrate support surface 21a on which the wafer W is placed. The substrate support 21 is movable in a horizontal direction (X direction and Y direction) and a vertical direction (Z direction) with respect to a bottom portion of the inspection part 20, and is rotatable about a vertical axis (θ direction). The substrate support 21 includes a vacuum chuck, and attracts and holds the wafer W placed on the substrate support surface 21a.

The elevating and rotating mechanism 22 supports the substrate support 21 to be movable (raised and lowered) in the vertical direction (Z direction) and rotatable about the vertical axis (θ direction). The elevating and rotating mechanism 22 includes, e.g., a stepping motor.

The XY stage 23 supports the elevating and rotating mechanism 22 to be movable in the horizontal direction (X direction and Y direction). The XY stage 23 moves the substrate support 21 supported by the elevating and rotating mechanism 22 in the horizontal direction via the elevating and rotating mechanism 22. The XY stage 23 includes, e.g., a stepping motor.

The probe card 24 is disposed above the substrate support 21. A plurality of probes 24a are formed on a portion of the probe card 24 facing the substrate support 21. The probe card 24 is detachably attached to a head plate 24b. A tester (not shown) is connected to the probe card 24 via a test head T.

The alignment mechanism 25 includes an upper camera 25a, guide rails 25b, an alignment bridge 25c, a lower camera 25d, and the like.

The upper camera 25a is attached to the center of the alignment bridge 25c while facing downward, and moves in the horizontal direction (Y direction) together with the alignment bridge 25c. The upper camera 25a is provided to align the wafer W on the substrate support 21, and acquires an image including the wafer W on the substrate support 21. The upper camera 25a is, e.g., a CCD camera or a CMOS camera.

The guide rails 25b support the alignment bridge 25c to be movable in the horizontal direction (Y direction).

The alignment bridge 25c is supported by the pair of guide rails 25b disposed on the right side and the left side, and moves in the horizontal direction (Y direction) along the guide rails 25b.

The lower camera 25d is attached to a side portion of the substrate support 21 while facing upward, and moves in the horizontal direction (X direction and Y direction) together with the substrate support 21. The lower camera 25d is provided to detect the positions of the plurality of probes 24a formed on the probe card 24, and acquires an image including the plurality of probes 24a. The lower camera 25d is, e.g., a CCD camera or a CMOS camera.

In the alignment mechanism 25, the upper camera 25a moves between a standby position and a position directly below the center of the probe card 24 (hereinafter, referred to as "probe center") via the alignment bridge 25c. The upper camera 25a located at the probe center acquires an image including an electrode pad of each chip on the wafer W placed on the substrate support 21 while the substrate support 21 is moving in the horizontal direction (X direction and Y direction) during alignment, and outputs the acquired image to the controller 30. Further, the lower camera 25d moves to the probe center via the substrate support 21. The lower camera 25d located at the probe center acquires an image including the plurality of probes 24a formed on the probe card 24 during alignment, and outputs the acquired image to the controller 30.

The controller 30 is disposed below the substrate support 21 and controls an overall operation of the inspection apparatus 1. Further, the controller 30 performs an alignment method to be described later. As shown in FIG. 3, the controller 30 is a computer having a drive device 31, an auxiliary storage device 32, a memory device 33, a CPU 34, an interface device 35, a display device 36, and the like, which are connected to each other by a bus 38.

A program for realizing processing in the controller 30 is provided by a recording medium 37 such as a CD-ROM or the like. When the recording medium 37 storing the program is set in the drive device 31, the program is installed in the auxiliary storage device 32 from the recording medium 37 via the drive device 31. However, the program is not necessarily installed from the recording medium 37, and may be downloaded from another computer via a network.

The auxiliary storage device 32 stores various types of information. The various types of information include, e.g., alignment information calculated in a chip unit mode and a card unit mode in the alignment method to be described later. The alignment information includes designed (or desired) gradient and center of a probe group, a measured gradient and center of the probe group, a gradient and center of the probe card 24, the deviation amount of the gradient, the deviation amount of the center, and the like.

The memory device 33 reads out a program from the auxiliary storage device 32 and stores the program when there is an instruction to start the program.

The CPU 34 executes a function related to the inspection apparatus 1 based on the program stored in the memory device 33.

The interface device 35 is used as an interface for connection to a network.

The display device 36 displays various types of information, and also functions as an operating part that accepts operations by an operator or the like.

In the inspection apparatus 1, the alignment mechanism 25 aligns the wafer W with the probe card 24 so that the probes 24a of the probe card 24 are accurately brought into contact with the electrode pads of each chip on the wafer W placed on the substrate support 21. Then, the elevating and rotating mechanism 22 raises the substrate support 21 to bring the probes 24a of the probe card 24 into contact with the corresponding electrode pads. Next, the controller 30 applies an inspection signal from the tester to each chip on the wafer W via the test head T and the probes 24a, and inspects electrical characteristics of each chip.

Alignment Method

An alignment method of the probe card 24 including a plurality of probe groups provided to correspond to a plurality of chips in the above-described inspection apparatus 1 will be described, as an example of an alignment method according to the embodiment, with reference to FIGS. 4 to 7.

The alignment method according to the embodiment includes selecting one of a chip unit mode and a card unit mode. However, the alignment method of the probe card 24 according to the embodiment may include the chip unit mode without including the card unit mode.

In the chip unit mode, the gradient and the center of the probe group are calculated for each chip, and the gradient and the center of the probe card 24 are calculated based on the calculated gradient and center of the plurality of probe groups.

In the card unit mode, the gradient and the center of the probe card 24 are calculated for each probe card. In other words, in the card unit mode, the gradient and the center of the probe card 24 are calculated while considering the probe card as one object.

In the following description, a case where the probe card 24 includes two probe groups PA and PB will be described as an example. The probe groups PA and PB are provided to correspond to different chips CA. Each chip includes a plurality of electrode pads, and each of the probe groups PA and PB includes a plurality of probes corresponding to the plurality of electrode pads of each chip.

The number of probe groups of the probe card 24 is not limited to two, and may be three or more, for example.

Chip Unit Mode

Figure 4A:
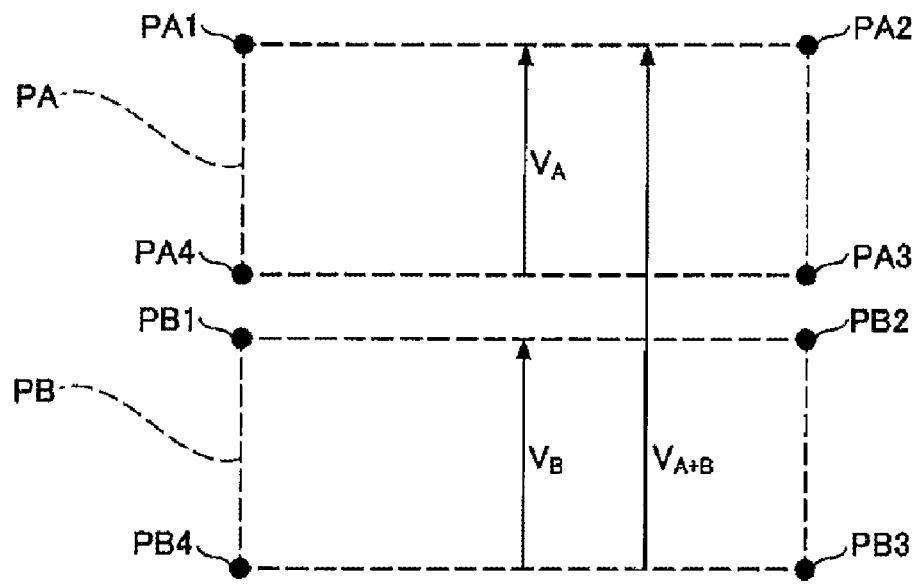
FIGS. 4A and 4B show an example of a method of calculating a gradient of a probe card in a chip unit mode.
Figure 4B:
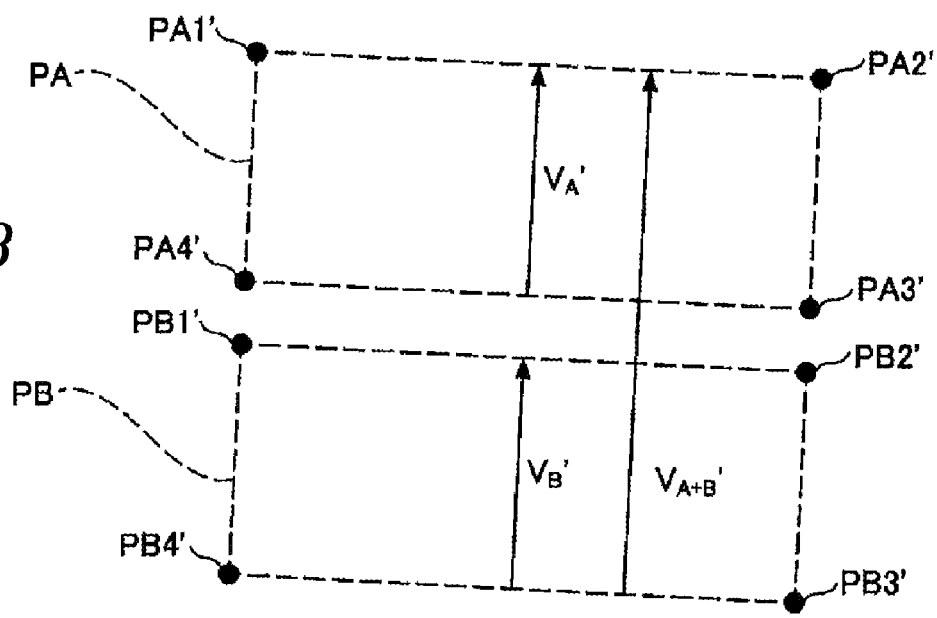

An example of a method of calculating a gradient of the probe card 24 in the chip unit mode will be described with reference to FIGS. 4A and 4B. FIGS. 4A and 4B show an example of the method of calculating a gradient of the probe card 24 in the chip unit mode. FIG. 4A explains designed position information of the probe group, and FIG. 4B explains measurement position information of the probe group.

First, as shown in FIG. 4A, the controller 30 calculates a designed gradient of the probe group PA (vector $V_A$) based on the designed position information of two or more probes included in the probe group PA. The two or more probes included in the probe group PA include, e.g., two or more probes among probes PA1 to PA4 of the probe group PA that are located at the four corners. Further, the controller 30 calculates a designed gradient of the probe group PB (vector $V_B$) based on the designed position information of two or more probes included in the probe group PB. The two or more probes included in the probe group PB include, e.g., two or more probes among probes PB1 to PB4 of the probe group PB that are located at the four corners. The designed position information of the two or more probes included in the probe group PA and the designed position information of the two or more probes included in the probe group PB may be, e.g., needle position information obtained from a designed value of the probe card 24. Further, the position information may be, e.g., needle position information obtained by teaching the probe card 24.

Further, the controller 30 calculates a designed gradient of the probe card 24 (vector $V_{A+B}$) based on the designed gradient of the probe group PA (vector $V_A$) and the designed gradient of the probe group PB (vector $V_B$). The designed gradient of the probe card 24 (vector $V_{A+B}$) may be, e.g., the average value or the median value of the designed gradient of the probe group PA (vector $V_A$) and the designed gradient of the probe group PB (vector $V_B$).

Next, as shown in FIG. 4B, the controller 30 calculates a measured gradient of the probe group PA (vector $V_A'$) based on the measured position information of two or more probes included in the probe group PA. The two or more probes included in the probe group PA include, e.g., two or more probes among probes PA1' to PA4' of the probe group PA that are located at the four corners. Further, the controller 30 calculates a measured gradient of the probe group PB (vector $V_B'$) based on the measured position information of two or more probes included in the probe group PB. The two or more probes included in the probe group PB include, e.g., two or more probes among probe PB1' to PB4' of the probe group PB that are located at the four corners. The measured position information of the two or more probes included in the probe group PA and the measured position information of the two or more probes included in the probe group PB may be needle position information obtained by imaging the probe card 24 using the lower camera 25d.

Further, the controller 30 calculates a measured gradient of the probe card 24 (vector $V_{A+B}'$) based on the measured gradient of the probe group PA (vector $V_A'$) and the measured gradient of the probe group PB (vector $V_B'$). The measured gradient of the probe card 24 (vector $V_{A+B}'$) may be, e.g., the average value or the median value of the measured gradient of the probe group PA (vector $V_A'$) and the measured gradient of the probe group PB (vector $V_B'$).

Next, the controller 30 calculates the deviation amount of the gradient (vector $V_{A+B}'$–vector $V_{A+B}$) that is the deviation amount of the measured gradient of the probe group PA (vector $V_{A+B}'$) with respect to the designed gradient of the probe group PA (vector $V_{A+B}$). The calculated deviation amount of the gradient is used when aligning the electrode pads of each chip on the wafer W placed on the substrate support 21 with the plurality of probes 24a formed on the probe card 24.

Figure 5A:
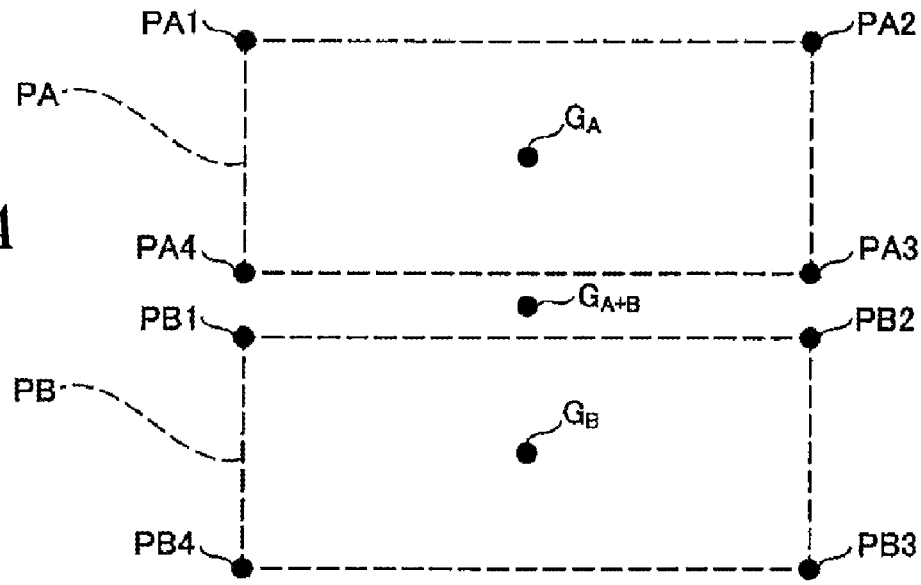
FIGS. 5A and 5B show an example of a method of calculating the center of a probe card in the chip unit mode.
Figure 5B:
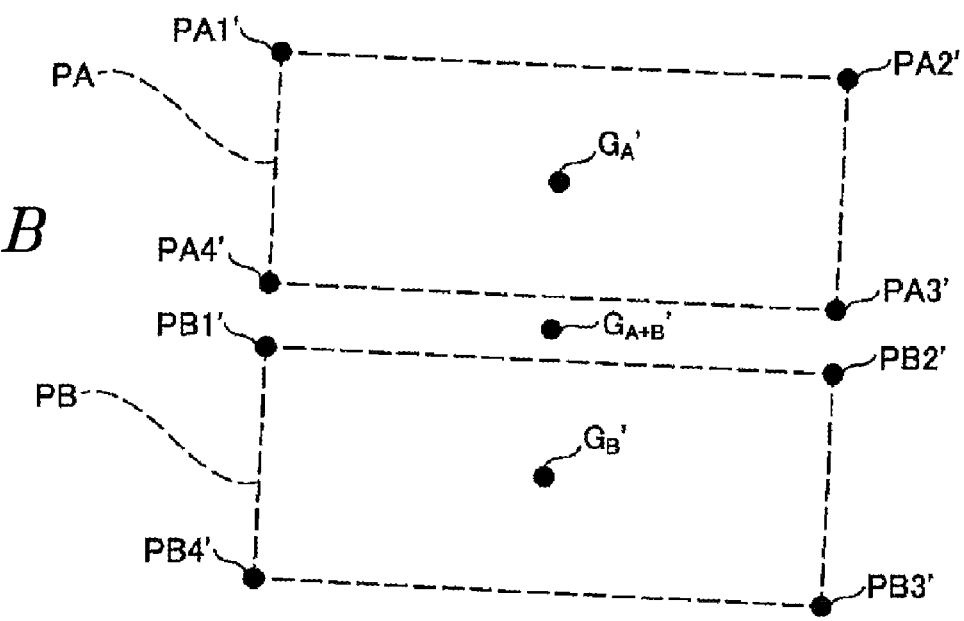

An example of a method of calculating the center of the probe card 24 in the chip unit mode will be described with reference to FIGS. 5A and 5B. FIGS. 5A and 5B show an example of the method of calculating the center of the probe card 24 in the chip unit mode. FIG. 5A explains designed position information of the probe group, and FIG. 5B explains measured position information of the probe group.

First, as shown in FIG. 5A, the controller 30 calculates a designed center $G_A$ of the probe group PA based on the designed position information of two or more probes included in the probe group PA. The two or more probes included in the probe group PA include, e.g., two or more probes among probes PA1 to PA4 of the probe group PA that are located at the four corners. Further, the controller 30 calculates a designed center $G_B$ of the probe group PB based on the designed position information of two or more probes included in the probe group PB. The two or more probes included in the probe group PB include, e.g., two or more probes among probes PB1 to PB4 of the probe group PB that are located at the four corners. Further, the controller 30 calculates a designed center $G_{A+B}$ of the probe card 24 based on the designed center $G_A$ of the probe group PA and the designed center $G_B$ of the probe group PB. The designed center $G_{A+B}$ of the probe card 24 may be, e.g., the average value or the median value of the designed center $G_A$ of the probe group PA and the designed center $G_B$ of the probe group PB.

Then, as shown in FIG. 5B, the controller 30 calculates a measured center $G_A'$ of the probe group PA based on the measured position information of two or more probes included in the probe group PA. The two or more probes included in the probe group PA include, e.g., two or more probes among probes PA1' to PA4' of the probe group PA that are located at the four corners. Further, the controller 30 calculates a measured center $G_B'$ of the probe group PB based on the measured position information of two or more probes included in the probe group PB. The two or more probes included in the probe group PB include, e.g., two or more of probes PB1' to PB4' of the probe group PB that are located at the four corners. Further, the controller 30 calculates a measured center $G_{A+B}'$ of the probe card 24 based on the measured center $G_A'$ of the probe group PA and the measured center $G_B'$ of the probe group PB. The measured center $G_{A+B}'$ of the probe card 24 may be, e.g., the average value or the median value of the measured center $G_A'$ of the probe group PA and the measured center $G_B'$ of the probe group PB.

Next, the controller 30 calculates the deviation amount of the center $G_{A+B}'+G_{A+B}$ that is the deviation amount of the measured center $G_{A+B}'$ of the probe card 24 with respect to the designed center $G_{A+B}$ of the probe card 24. The calculated deviation amount of the center is used when aligning the electrode pads of each chip on the wafer W placed on the substrate support 21 with the plurality of probes 24a formed on the probe card 24.

Further, the controller 30 may store the alignment information calculated in the chip unit mode in the auxiliary storage device 32. The alignment information includes the designed gradient and center of the probe groups PA and PB, the measured gradient and center of the probe groups PA and PB, the gradient and the center of the probe card 24, the deviation amount of the gradient, the deviation amount of the center, and the like.

Card Unit Mode

Figure 6A:
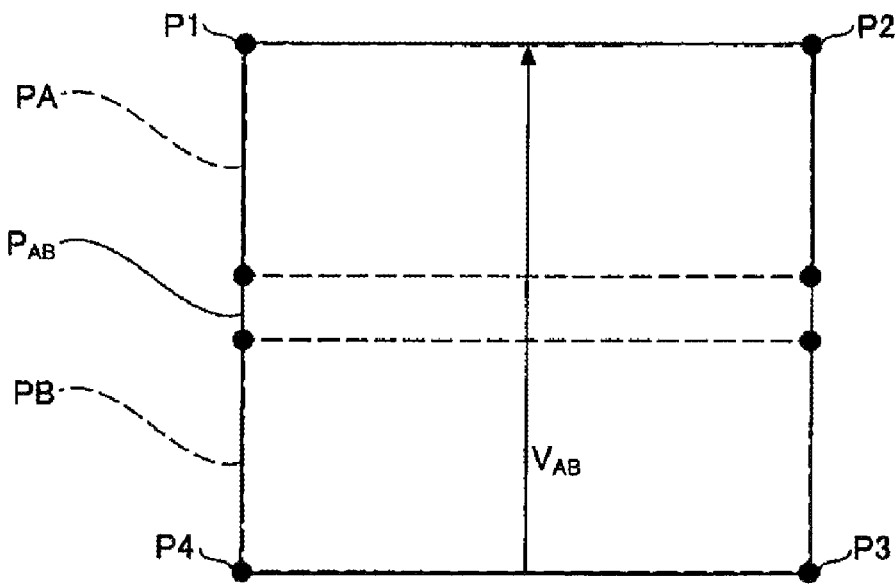
FIGS. 6A and 6B show an example of a method of calculating a gradient of a probe card in a card unit mode.
Figure 6B:
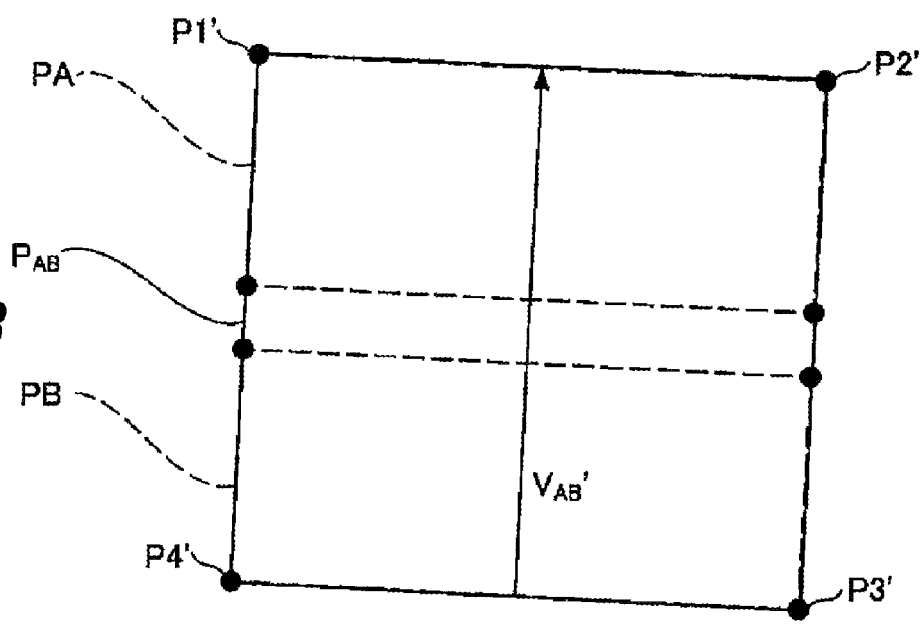

An example of a method of calculating the gradient of the probe card 24 in the card unit mode will be described with reference to FIGS. 6A and 6B. FIGS. 6A and 6B show an example of the method of calculating the gradient of the probe card 24 in the card unit mode. FIG. 6A explains the designed position information of the probe group, and FIG. 6B explains the measured position information of the probe group.

First, as shown in FIG. 6A, the controller 30 calculates a designed gradient of the probe card 24 (vector $V_{AB}$) based on the designed position information of two or more probes included in the probe groups PA and PB. The two or more probes included in the probe groups PA and PB include, e.g., two or more probes among probes P1 to P4 located at the four corners of $P_{AB}$ consisting of the probe groups PA and PB. The designed position information of the two or more probes included in the probe groups PA and PB may be, e.g., needle position information obtained from the designed value of the probe card 24. Further, the position information may be, e.g., needle position information obtained by teaching the probe card 24.

Next, as shown in FIG. 6B, the controller 30 calculates a measured gradient of the probe card 24 (vector $V_{AB}'$) based on the measured position information of two or more probes included in the probe groups PA and PB. The two or more probes included in the probe groups PA and PB include, e.g., two or more probes among probes P1' to P4' located at the four corners of the PAB consisting of the probe groups PA and PB. The measured position information of the two or more probes included in the probe groups PA and PB may be, e.g., needle position information obtained by imaging the probe card 24 using the lower camera 25d.

Next, the controller 30 calculates the deviation amount of the gradient (vector $V_{AB}'$–vector $V_{AB}$) that is the deviation amount of the measured gradient of the probe card 24 (vector $V_{AB}'$) with respect to the designed gradient of the probe card 24 (vector $V_{AB}$). The calculated deviation amount of the gradient is used when aligning the electrode pads of each chip on the wafer W placed on the substrate support 21 with the plurality of probes 24a formed on the probe card 24.

Figure 7A:
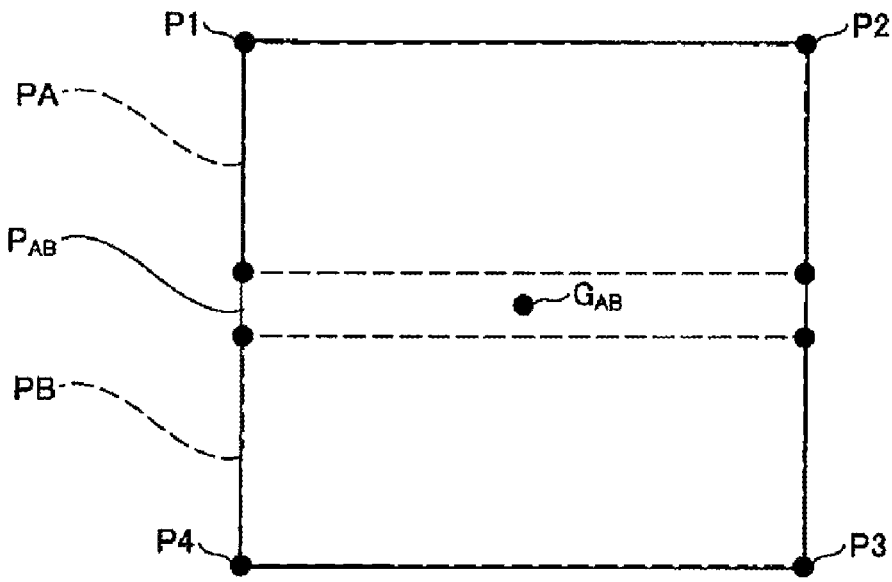
FIGS. 7A and 7B show an example of a method of calculating the center of a probe card in the card unit mode.
Figure 7B:
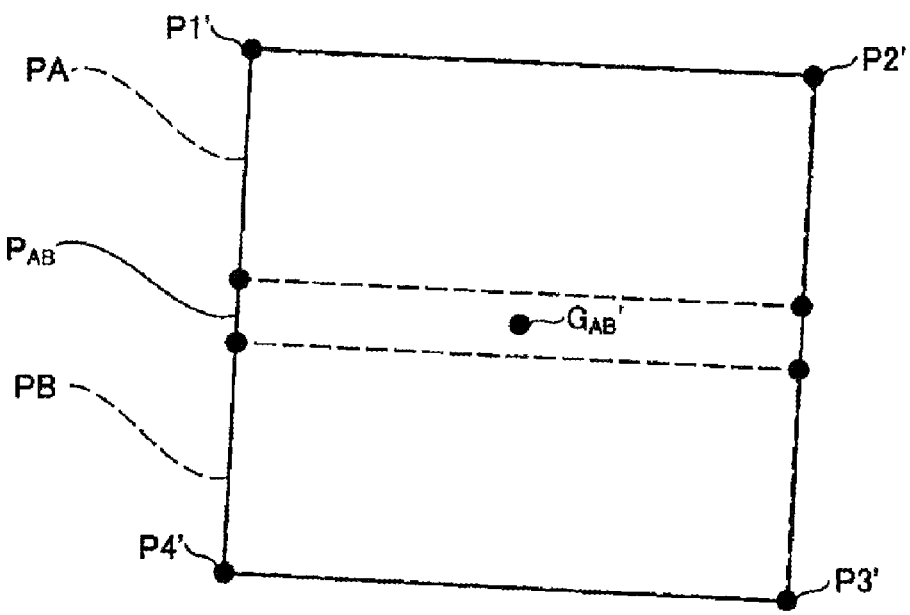

An example of a method of calculating the center of the probe card 24 in the card unit mode will be described with reference to FIGS. 7A and 7B. FIGS. 7A and 7B show an example of the method of calculating the center of the probe card 24 in the card unit mode. FIG. 7A explains the designed position information of the probe group, and FIG. 7B explains the measured position information of the probe group.

First, as shown in FIG. 7A, the controller 30 calculates the designed center $G_{AB}$ of the probe card 24 based on the designed position information of two or more probes included in the probe groups PA and PB. The two or more probes included in the probe groups PA and PB include, e.g., two or more probes among probes P1 to P4 located at the four corners of the $P_{AB}$ consisting of the probe groups PA and PB.

Then, as shown in FIG. 7B, the controller 30 calculates a measured center $G_{AB}'$ of the probe card 24 based on the measured position information of the two or more probes included in the probe groups PA and PB. The two or more probes included in the probe groups PA and PB include, e.g., two or more probes among probes P1' to P4' located at the four corners of the $P_{AB}$ consisting of the probe groups PA and PB.

Next, the controller 30 calculates the deviation amount of the center $G_{AB}'$–$G_{AB}$ that is the deviation amount of the measured center $G_{AB}'$ of the probe card 24 with respect to the designed center $G_{AB}$ of the probe card 24. The calculated deviation amount of the center is used when aligning the electrode pads of each chip on the wafer W placed on the substrate support 21 with the plurality of probes 24a formed on the probe card 24.

Further, the controller 30 may store the alignment information calculated in the card unit mode in the auxiliary storage device 32. The alignment information includes the gradient and center of the probe card 24, the deviation amount of the gradient, the deviation amount of the center, and the like.

Alignment of Probe Card and Wafer

An example of a positional relationship between a probe group and a chip in the case of selecting the chip unit mode in the alignment method according to the embodiment will be described with reference to FIGS. 8A to 8C. FIGS. 8A to 8C explain the positional relationship between the probe group and the chip in the chip unit mode.

First, as shown in FIG. 8A, the controller 30 calculates the designed gradient of the probe card 24 (vector $V_{A+B}$) based on the designed gradient of the probe group PA (vector $V_A$) and the designed gradient of the probe group PB (vector $V_B$). As shown in FIG. 8A, the controller 30 calculates the designed center $G_{A+B}$ of the probe card 24 based on the designed center $G_A$ of the probe group PA and the designed center $G_B$ of the probe group PB. The methods of calculating the designed gradient of the probe card 24 (vector $V_{A+B}$) and the designed center $G_{A+B}$ of the probe card 24 may be the same as the methods described with reference to FIGS. 4A and 5A, respectively.

Next, as shown in FIG. 8B, the controller 30 calculates the measured gradient of the probe card 24 (vector $V_{A+B}'$) based on the measured gradient of the probe group PA (vector $V_A'$) and the measured gradient of the probe group PB (vector $V_B'$). Further, as shown in FIG. 8B, the controller 30 calculates the measured center $G_{A+B}'$ of the probe card 24 based on the measured center $G_A'$ of the probe group PA and the measured center $G_B'$ of the probe group PB. The methods of calculating the measured gradient of the probe card 24 (vector $V_{A+B}'$) and the measured center $G_{A+B}'$ of the probe card 24 may be the same as the methods described with reference to FIGS. 4B and 5B, respectively.

Next, the controller 30 calculates the deviation amount of the gradient (vector $V_{A+B}'$–vector $V_{A+B}$) that is the deviation amount of the measured gradient of the probe card 24 (vector $V_{A+B}'$) with respect to the designed gradient of the probe card 24 (vector $V_{A+B}$). In the example of FIGS. 8A and 8B, the designed gradient of the probe card 24 (vector $V_{A+B}$) and the measured gradient of the probe card 24 (vector $V_{A+B}'$) are the same, so that the deviation amount of the gradient of the probe card 24 is zero. Further, the controller 30 calculates the deviation amount of the center $G_{A+B}'$–$G_{A+B}$ that is the deviation amount of the measured center $G_{A+B}'$ of the probe card 24 with respect to the designed center $G_{A+B}$ of the probe card 24.

Next, as shown in FIG. 8C, the controller 30 aligns the electrode pads of chips CA and CB on the wafer W with the probe groups PA and PB of the probe card 24 based on the calculated deviation amount of the gradient and the calculated deviation amount of the center of the probe card 24. At this time, the deviation amount of the gradient of the probe card 24 is zero as described above, so that the wafer W is aligned with the probe card 24 such that the wafer W is horizontally moved by the amount corresponding to the deviation amount of the center of the probe card 24.

Figure 9A:
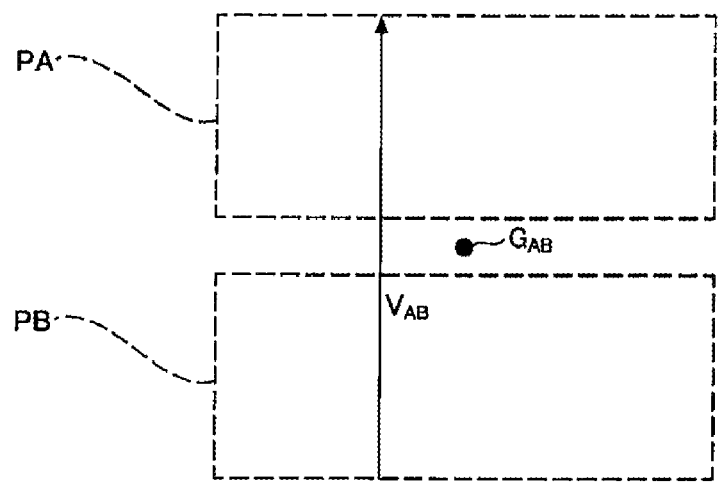
FIGS. 9A to 9C explain a positional relationship between a probe group and a chip in the card unit mode.
Figure 9B:
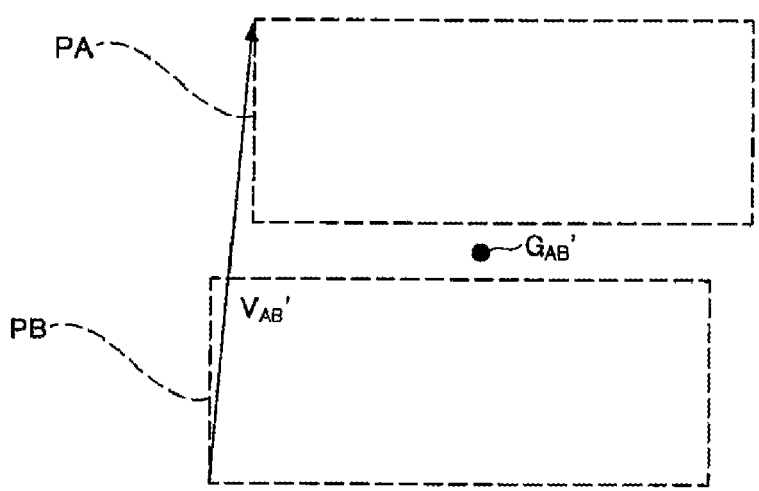
Figure 9C:
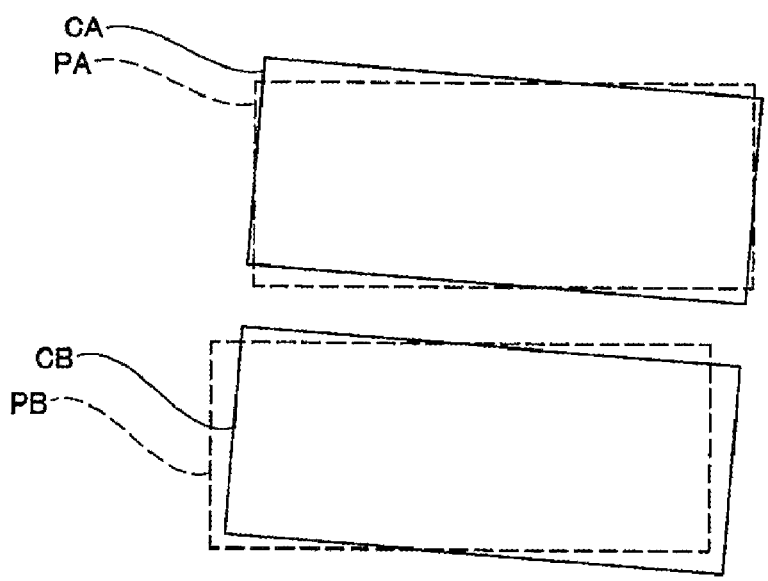

An example of the positional relationship between the probe group and the chip in the card unit mode in the alignment method according to the embodiment will be described with reference to FIGS. 9A to 9C. FIGS. 9A to 9C explain the positional relationship between the probe group and the chip in the case of selecting the card unit mode.

First, as shown in FIG. 9A, the controller 30 calculates the designed gradient of the probe card 24 (vector $V_{AB}$) and the designed center $G_{AB}$ of the probe card 24. The methods of calculating the designed gradient of the probe card 24 (vector $V_{AB}$) and the designed center $G_{AB}$ of the probe card 24 may be the same as the methods described with reference to FIGS. 6A and 7A, respectively.

Next, as shown in FIG. 9B, the controller 30 calculates the measured gradient of the probe card 24 (vector $V_{AB}'$) and the measured center $G_{AB}'$ of the probe card 24. The methods of calculating the measured gradient of the probe card 24 (vector $V_{AB}'$) and the measured center $G_{AB}'$ of the probe card 24 may be the same as the methods described with reference to FIGS. 6B and 7B, respectively.

Then, the controller 30 calculates the deviation amount of the gradient (vector $V_{AB}'$−vector $V_{AB}$) that is the deviation amount of the measured gradient of the probe card 24 (vector $V_{AB}'$) with respect to the designed gradient of the probe card 24 (vector $V_{AB}$). Further, the controller 30 calculates the deviation amount of the center $G_{AB}'$−$G_{AB}$ that is the deviation amount of the measured center $G_{AB}'$ of the probe card 24 with respect to the designed center $G_{AB}'$ of the probe card 24.

Next, as shown in FIG. 9C, the controller 30 aligns the electrode pads of the chips CA and CB on the wafer W with the probe groups PA and PB of the probe card 24 based on the deviation amount of the gradient and the deviation amount of the center of the probe card 24. At this time, the wafer W is aligned with the probe card 24 such that the wafer W is rotated by the deviation amount of the gradient of the probe card 24 and horizontally moved by the deviation amount of the center of the probe card 24.

As described above, the alignment method according to the embodiment includes the chip unit mode in which the gradient and the center of the probe group are calculated for each chip, and the gradient and the center of the probe card 24 are calculated based on the calculated gradient and the calculated center of the plurality of probe groups. Accordingly, it is possible to align the electrode pads with the probes with a high accuracy even if there is misalignment between the chips.

The alignment method according to the embodiment includes selecting one of the chip unit mode and the card unit mode. Accordingly, a user can select any one of the chip unit mode and the card unit mode depending on the type of the probe card and perform the alignment of the probe card.

In the above embodiment, the case where a user selects any one of the chip unit mode and the card unit mode to perform the alignment method of the probe card 24 has been described. However, the present disclosure is not limited thereto. For example, the user may select the chip unit mode to calculate the gradient of the probe card 24 and select the card unit mode to calculate the center of the probe card 24. Alternatively, for example, the user may select the card unit mode to calculate the gradient of the probe card 24 and select the chip unit mode to calculate the center of the probe card 24.

In the above embodiment, the controller 30 is an example of a control device.

The embodiments of the present disclosure are considered to be illustrative in all respects and not restrictive. The above-described embodiments may be omitted, replaced or modified in various forms without departing from the scope of the appended claims and the gist thereof.

The invention claimed is:

1. An inspection apparatus comprising:
a substrate support on which a substrate is placed;
a probe card including a plurality of probe groups provided to respectively correspond to a plurality of chips formed on the substrate, wherein each of the plurality of chips includes electrode pads, and each of the plurality of probe groups includes probes that correspond to the electrode pads of each of the plurality of chips;
a camera for detecting positions of the probes; and
a controller,
wherein the controller is configured to perform a first mode for:
calculating a probe group vector of the probe group based on position information of two or more probes included in the probe group for each of the plurality of chips, wherein the position information is obtained by imaging the probe card using the camera,
calculating a probe group center of the probe group based on the position information of two or more probes included in the probe group for each of the plurality of chips,
calculating a probe card center of the probe card based on the calculated probe group centers of the plurality of probe groups,
calculating a probe card vector of the probe card based on the calculated probe group vectors of the plurality of probe groups,
calculating a deviation amount of the calculated probe card vector with respect to a designed probe card vector and a deviation amount of the calculated probe card center with respect to a designed probe card center; and
aligning the electrode pads of the chips with the probes of the probe groups based on the calculated deviation amount of the probe card vector and the calculated deviation amount of the probe card center.

2. The inspection apparatus of claim 1, wherein the two or more probes are two or more probes among the probes located at four corners of the probe group.

3. The inspection apparatus of claim 1, wherein the controller is configured to perform a second mode for:
calculating the probe card vector and the probe card center of the probe card based on position information of two or more probes included in the plurality of probe groups.

4. The inspection apparatus of claim 3, wherein the two or more probes included in the plurality of probe groups are two or more probes among probes located at four corners of the plurality of probe groups.

5. The inspection apparatus of claim 3, wherein the controller is configured to select the first mode or the second mode.

6. The inspection apparatus of claim 1, wherein the controller is configured to perform a third mode for:
calculating the probe group vector based on the position information of the two or more probes included in the probe group for each of the plurality of chips, and calculating the probe card vector based on the calculated vectors of the plurality of probe groups, and
calculating the probe card center based on the position information of two or more probes included in the plurality of probe groups.

7. The inspection apparatus of claim 1, wherein the controller is configured to perform a fourth mode for:
calculating the probe card vector based on the position information of two or more probes included in the plurality of probe groups, and
calculating the probe group center based on the position information of the two or more probes included in the probe group for each of the plurality of chips, and calculating the probe card center based on the calculated centers of the plurality of probe groups.

* * * * *